(12) United States Patent
Mohapatra et al.

(10) Patent No.: US 10,461,193 B2
(45) Date of Patent: Oct. 29, 2019

(54) APPARATUS AND METHODS TO CREATE A BUFFER WHICH EXTENDS INTO A GATED REGION OF A TRANSISTOR

(71) Applicant: Intel Corporation, Santa Clara, CA (US)

(72) Inventors: Chandra S. Mohapatra, Beaverton, OR (US); Gilbert Dewey, Hillsboro, OR (US); Anand S. Murthy, Portland, OR (US); Glenn A. Glass, Portland, OR (US); Willy Rachmady, Beaverton, OR (US); Jack T. Kavalieros, Portland, OR (US); Tahir Ghani, Portland, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/575,322

(22) PCT Filed: May 27, 2015

(86) PCT No.: PCT/US2015/032612
§ 371 (c)(1),
(2) Date: Nov. 17, 2017

(87) PCT Pub. No.: WO2016/190858
PCT Pub. Date: Dec. 1, 2016

(65) Prior Publication Data
US 2018/0158958 A1 Jun. 7, 2018

(51) Int. Cl.
*H01L 29/00* (2006.01)
*H01L 29/786* (2006.01)
(Continued)

(52) U.S. Cl.
CPC .... *H01L 29/78609* (2013.01); *H01L 29/0673* (2013.01); *H01L 29/1054* (2013.01);
(Continued)

(58) Field of Classification Search
None
See application file for complete search history.

(56) References Cited

U.S. PATENT DOCUMENTS

| 9,023,705 B1 | 5/2015 | Paul et al. |
| 2007/0235763 A1* | 10/2007 | Doyle ................ H01L 29/785 257/202 |

(Continued)

OTHER PUBLICATIONS

International Search Report and Written Opinion from PCT/US2015/032612 dated Feb. 26, 2016, 11 pgs.
(Continued)

*Primary Examiner* — Fernando L Toledo
*Assistant Examiner* — Valerie N Newton
(74) *Attorney, Agent, or Firm* — Green, Howard & Mughal LLP

(57) ABSTRACT

Transistor devices may be formed having a buffer between an active channel and a substrate, wherein the active channel and a portion of the buffer form a gated region. The active channel may comprise a low band-gap material on a sub-structure, e.g. the buffer, between the active channel and the substrate. The sub-structure may comprise a high band-gap material having a desired conduction band offset, such that leakage may be arrested without significant impact on electron mobility within the active channel. In an embodiment, the active channel and the sub-structure may be formed in a narrow trench, such that defects due to lattice mismatch between the active channel and the sub-structure are terminated in the sub-structure.

18 Claims, 6 Drawing Sheets

(51) Int. Cl.
*H01L 29/06* (2006.01)
*H01L 29/423* (2006.01)
*H01L 29/66* (2006.01)
*H01L 29/78* (2006.01)
*H01L 29/10* (2006.01)

(52) U.S. Cl.
CPC .. *H01L 29/42392* (2013.01); *H01L 29/66522* (2013.01); *H01L 29/66742* (2013.01); *H01L 29/66795* (2013.01); *H01L 29/785* (2013.01); *H01L 29/78681* (2013.01); *H01L 29/78696* (2013.01)

(56) References Cited

U.S. PATENT DOCUMENTS

| | | |
|---|---|---|
| 2012/0319211 A1 | 12/2012 | Dal et al. |
| 2013/0043506 A1 | 2/2013 | Tsai et al. |
| 2013/0175659 A1 | 7/2013 | Liu |
| 2013/0234147 A1 | 9/2013 | Wu et al. |

OTHER PUBLICATIONS

International Preliminary Report on Patentability from PCT/US2015/032612 dated Dec. 7, 2017, 10 pgs.
Extended European Search Report from European Patent Application No. 15893498.4 dated Dec. 7, 2018, 8 pgs.
Examination Report from European Patent Application No. 15893498.4 dated Aug. 20, 2019, 4 pgs.

* cited by examiner

APPARATUS AND METHODS TO CREATE A BUFFER WHICH EXTENDS INTO A GATED REGION OF A TRANSISTOR

CLAIM OF PRIORITY

This Application is a National Stage Entry of, and claims priority to, PCT Application No. PCT/US2015/032612, filed on 27 May 2015 and titled "APPARATUS AND METHODS TO CREATE A BUFFER WHICH EXTENDS INTO A GATED REGION OF A TRANSISTOR", which is incorporated by reference in its entirety for all purposes.

TECHNICAL FIELD

Embodiments of the present description generally relate to the field of microelectronic devices, and, more particularly, to forming a buffer, such as a high band gap sub-structure, adjacent to an active channel in a non-planar microelectronic transistor, wherein a portion of the buffer extends into a gated region of the non-planar microelectronic transistor.

BACKGROUND

Higher performance, lower cost, increased miniaturization of integrated circuit components, and greater packaging density of integrated circuits are ongoing goals of the microelectronic industry for the fabrication of microelectronic devices. To achieve these goals, transistors within the microelectronic devices must scale down, i.e. become smaller. Along with the reduction in the size of transistors, there has also been a drive to improve their efficiency with improvement in their designs, materials used, and/or in their fabrication processes. Such design improvements include the development of unique structures, such as non-planar transistors, including tri-gate transistors, FinFETs, TFETS, omega-FETs, and double-gate transistors.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
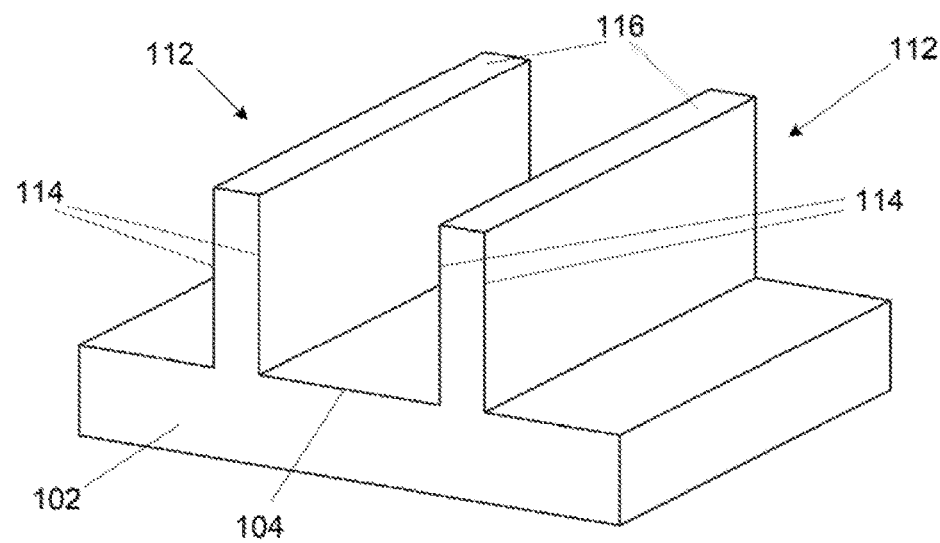
FIGS. 1-10 are oblique sectional and side cross-sectional views of the fabrication of a non-planar transistor, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

As will be understood to those skilled in the art, controlling the source to drain leakage through ungated sub-substructure materials below active channels is an important consideration in any transistor design. In non-planar transistor devices, such III-VNMOS trigate devices, sub-structure leakage presents more of a challenge. This challenge stems from the high mobility materials which are required for the formation of active channel in order to achieve high electron mobility, which inherently have low band gap and, hence, high conductivity. The existing solution involves doping the sub-structure with a p-type dopant (e.g. e17-e18 acceptors/cc). However, this solution path may not work efficiently for short channel non-planar transistors. For the purposes of the present description, the term "short channel" may be defined to mean gate lengths ("$L_g$") of less than about 20 nm.

Embodiments of the present description relate to the fabrication of transistor devices having a buffer between an active channel and a substrate, wherein a portion of the buffer extends into a gated region of the transistor. In at least one embodiment of the present description, an active channel comprising a low band-gap III-V material may be epitaxially grown on a sub-structure, e.g. a buffer, between the active channel and the substrate. The sub-structure may comprise a high band-gap III-V material, which may have a desired conduction band offset, such that leakage may be arrested without having a significant impact on electron mobility within the active channel Within the embodiments of the present description, leakage may be decreased by at least three orders of magnitude compared with forming an active channel without such a buffer. In an embodiment of the present description, the active channel and the substructure may be formed in a narrow trench, such that defects due to lattice mismatch between the active channel and the sub-structure are terminated by defect trapping in the sub-structure below the active channel region.

Furthermore, embodiments of the present description include forming a gated region which includes a portion of the sub-structure. When a high band-gap material (e.g. the sub-structure) interfaces with a low band-gap material (e.g. the active channel), a potential well of electrons may be formed. If this well of electrons is created outside the gated region, then the gate will not be able to efficiently deplete the well completely. Having a portion of the sub-substructure interfacing the active channel inside the gated region may allow for the entire channel (including the potential well of electrons at the interface) to be depleted. As a result, we will have better short channel control and get a better performing transistor, particularly with short channel transistors where the transistor performance may be affected by the short channel effects, as will be understood to those skilled in the art. Specifically, embodiments of the present description may achieve gate control of the active channel ensuring that the entire active channel could be inverted when the transistor is in the ON state. Furthermore, by utilizing the high band-gap and high conduction band offset materials for the sub-substructure, the source-to-drain leakage through the sub-substructure is suppressed when the transistor is in the OFF state, and dislocations which could be created at the interface of the active channel and the sub-structure due to the lattice mismatch may be electrically inactive.

As shown in FIG. 1, at least one fin 112 may be formed on a substrate 102, wherein the fins 112 may include opposing sidewalls 114 extending from a first surface 104 of the substrate 102 and which terminate in an upper surface 116. For the clarity and brevity, only two fins 112 are illustrated in FIG. 1; however, it is understood that any appropriate number of fins 112 could be fabricated. In one embodiment, an etch mask (not shown) may be patterned on the substrate 102 followed by the etching of the substrate 102, wherein the portions of the substrate 102 protected by etch mask (not shown) become the fins 112, and the etch mask (not shown) may be thereafter removed, as will be understood to those skilled in the art. In an embodiment of the present disclosure, the substrate 102 and the fins 112 may be any appropriate material, including, but not limited to, a silicon-containing material, such as monocrystalline silicon. The substrate 102 and the fins 112, however, need not necessarily be fabricated from silicon-containing materials, and can be other types of materials known in the art. In a further embodiment, the substrate 102 may comprise a silicon-on-insulator (SOI) substrate, a silicon-on-nothing (SON), a germanium substrate, a germanium-on-insulator (GeOI) substrate, or a germanium-on-nothing (GeON).

Figure 2:
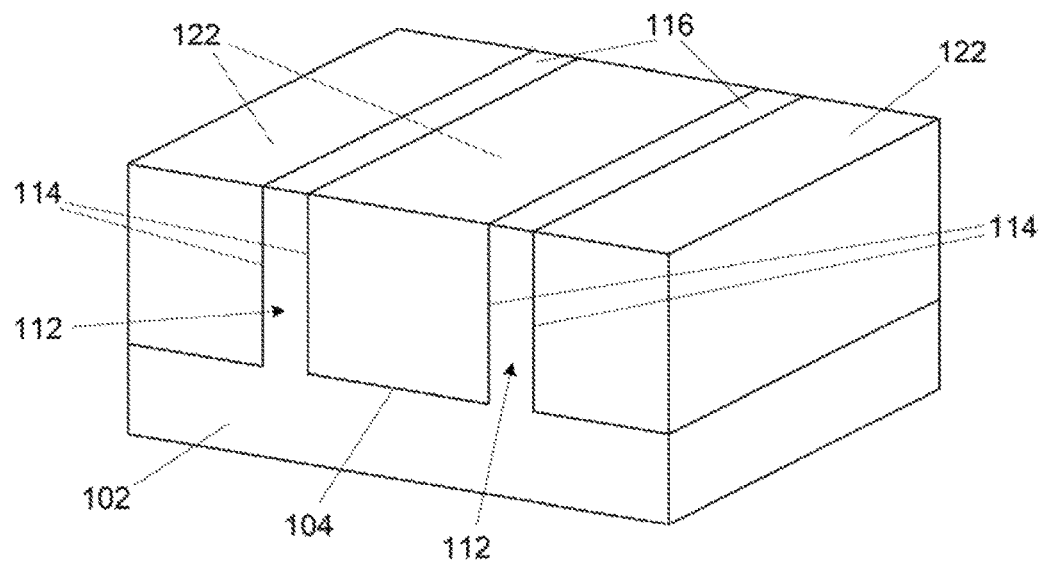

As shown in FIG. 2, a dielectric material may be deposited, by any appropriate deposition process, over the substrate 102 and the fins 112, and the dielectric material may be planarized to exposed the fin upper surface 116, thereby forming isolation structures 122, known as shallow trench isolation structures, abutting the opposing fin sidewalls 114. The isolation structures 122 may be formed from any appropriate dielectric material, including but not limited to, silicon oxide ($SiO_2$).

Figure 3:
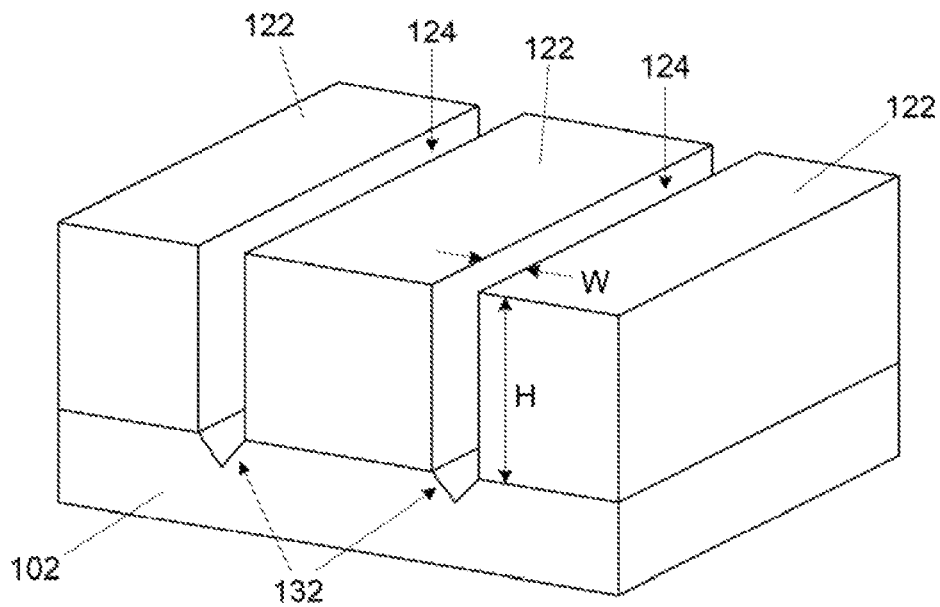

As shown in FIG. 3, the fins 112 may be removed, thereby forming a trench 124. The fins 112 may be removed by any known etching techniques, including, but not limited to, dry etching, wet etching, or combinations thereof. In one embodiment, a portion of each trench 124 may be formed to extend into the substrate 102 either during the removal of the fins 112 or thereafter. This portion of the trench 124 will hereinafter be referred to as a nucleation trench 132. In one embodiment, the nucleation trench 132 may have a (111) faceting, which may facilitate the growth of a III-V material, as will be discussed. It is understood that alternate geometries of the nucleation trench 132 may be utilized.

Figure 4:
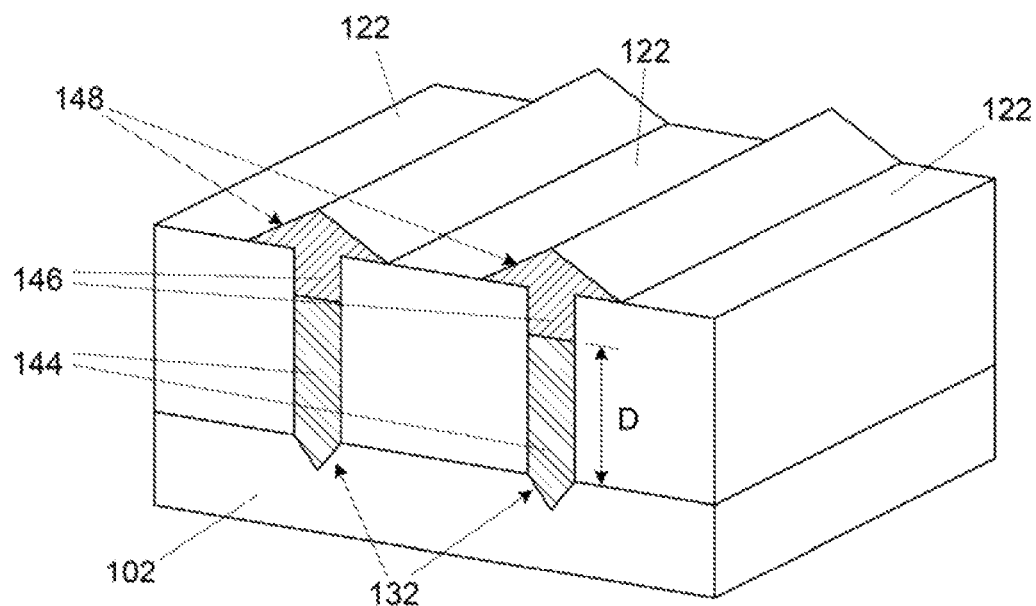

As shown in FIG. 4, a sub-structure 144 may be formed within the trench 124 (see FIG. 3). The sub-structure 144 may be formed by any known formation process, and may be any appropriate material, such as a high band-gap III-V material, including, but not limited to, indium aluminum arsenide, indium phosphide, gallium phosphide, gallium arsenide, gallium arsenide antimonide, aluminium arsenide antimonide, indium aluminum gallium arsenide, indium aluminum gallium phosphide, aluminum gallium arsenide, and the like. For the purpose of the present description, a high band-gap material may be defined to be a material that has a band-gap greater than silicon.

Although not specifically illustrated, a nucleation layer may be formed in the nucleation trench prior to the formation of the sub-structure. The nucleation layer may be formed by any formation process and may be any appropriate material, such as a III-V epitaxial material, including but not limited to, indium phosphide, gallium phosphide, gallium arsenide, and like.

As further shown in FIG. 4, an active channel 146 may be formed on the sub-structure 144 within the trench 124 (see FIG. 3). The active channel 146 may be formed by any known formation process, and may be any appropriate material, such as a low band-gap III-V epitaxial material, including, but not limited to indium gallium arsenide, indium arsenide, indium antimonide, and the like. For the purpose of the present description, a low band-gap material may be defined to be a material that has a band-gap less than silicon. In one embodiment, the active channel 146 may be substantially undoped (i.e. electrically neutral or lightly doped with a p-type dopant).

In some example embodiments, the sub-structure 144 and/or the active channel 146 may be epitaxially deposited. In some embodiments, a chemical vapor deposition (CVD) process or other suitable deposition technique may be used for depositing or otherwise forming the sub-structure 144 and/or the active channel For example, the deposition may be carried out by CVD, or rapid thermal CVD (RT-CVD), or low pressure CVD (LP-CVD), or ultra-high vacuum CVD (UHV-CVD), or gas source molecular beam epitaxy (GS-MBE) tools using III-V material compounds, such as combinations of indium, aluminum, arsenic, phosphorus, gallium, antimony, and/or precursors thereof. In one such specific example embodiment, the active channel 146 may be indium gallium arsenide and the sub-structure 144 may be indium phosphide. In any such embodiments, there may be a precursor bubbler with a carrier gas such as, for instance, hydrogen, nitrogen, or a noble gas (e.g., precursor may be diluted at about 0.1-20% concentration with the balance being carrier gas). In some example cases, there may be an arsenic precursor such as arsine or tertiary butyl arsine, a phosphorous precursor such as tertiary butylphosphine, a gallium precursor such as trimethylgallium, and/or an indium precursor such as trimethylindium. There may also be an etchant gas such as, for example, halogen-based gas such as hydrogen chloride (HCl), chlorine (Cl), or, hydrogen bromide (HBr). The basic deposition of the sub-structure 144 and/or the active channel 146 may be possible over a wide range of conditions using a deposition temperature in the range, for example, from between about 300° C. and 650° C., or in a more specific example, from between about 400 and 600° C.) and reactor pressure, for instance, in the range of between about 1 Torr and 760 Torr. Each of the carrier and etchants can have a flow in the range of between about 10 and 300 SCCM (typically, no more than 100 SCCM of flow is required, but some embodiments may benefit from higher flow rates). In one specific example embodiment, the deposition of the sub-structure 144 and/or the active channel 146 may be carried out at a flow rate that ranges between 100 and 1000 SCCM.

The material utilized for the sub-structure 144 may be selected to have the desired conduction band offset with the active channel 146 which will be effective in excluding electrons from the sub-structure 144, thereby reducing leakage. Furthermore, the formation of the sub-structure 144 and the active channel 146 may occur in a relatively narrow trench 124. In one embodiment, the narrow trench 124 may have a height H (see FIG. 3) in the range of about 50 to 500 nm and a width W (see FIG. 3) of less than about 25 nm (preferably less than 10 nm). Lattice mismatch between the substrate 102 and the sub-structure 144 can be larger than that which allows for substantially defect free formation, as the sub-structure 144 may be formed to have a sufficient depth D to trap defects, such as stacking faults, dislocations, and the like, away from the active channel 146, as will be understood to those skilled in the art. Thus, electron mobility in the active channel 146 may not be significantly impaired thereby. While the active channel 146 may not achieve theoretical maximum mobility values, it nevertheless provides a compelling performance advantage relative to silicon based n-MOS transistors. In one embodiment the sub-structure 144 may have a depth D (e.g. the distance between the substrate 102 and the active channel 146) of greater than about 50 nm and a width of less than about 25 nm (i.e. the trench width W).

Figure 5:
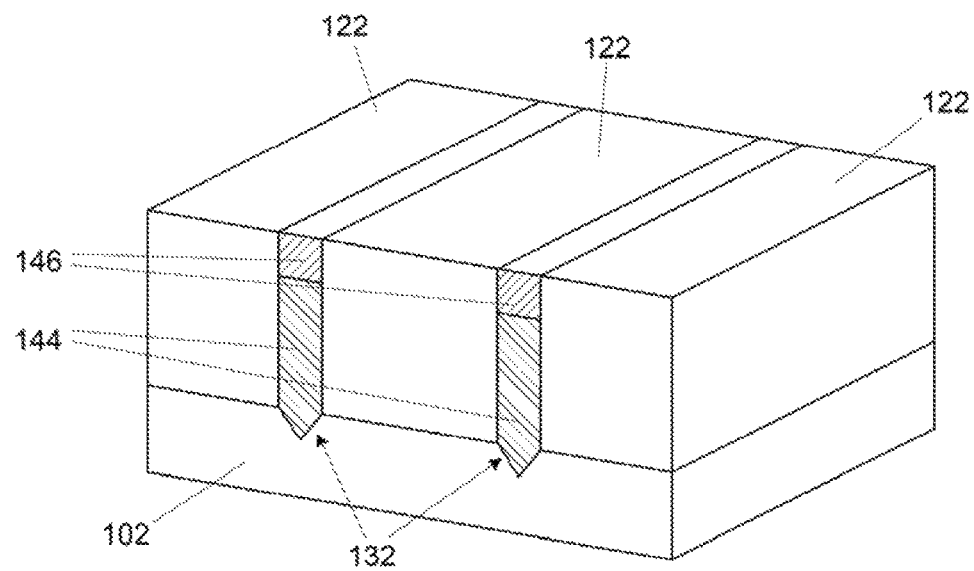

As still further shown in FIG. 4, a portion 148 of active channel 146 may extend out of the trench (see FIG. 3), particularly when epitaxial growth processes are utilized. Thus, as shown in FIG. 5, the portion 148 of the active channel 146 may be removed, such as by chemical mechanical planarization. In one embodiment, the sub-structure 144 may fill about 80% of the trench (see FIG. 3) and the active channel 146 may fill about 20% of the trench (see FIG. 3).

Figure 6:
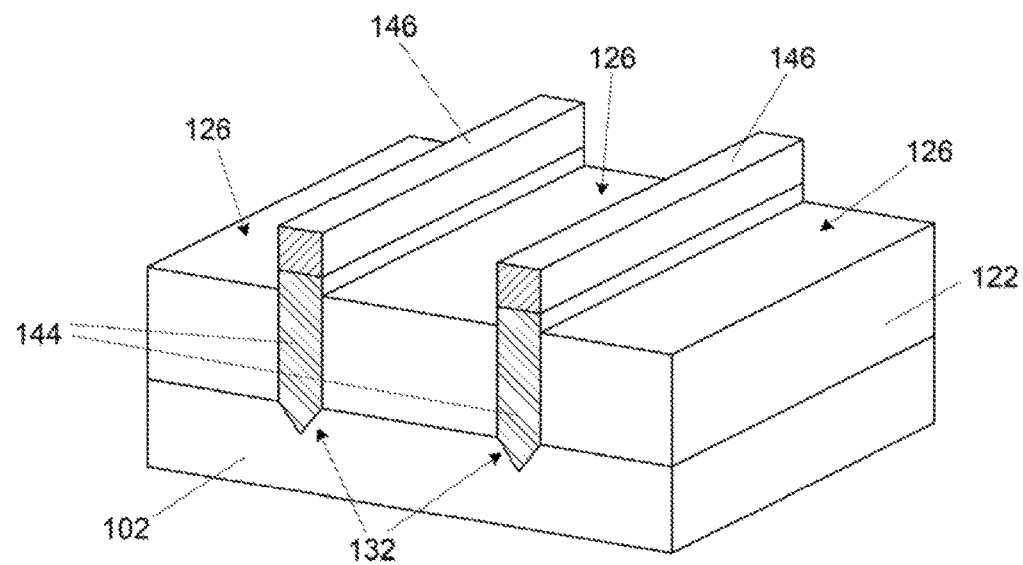
Figure 7:
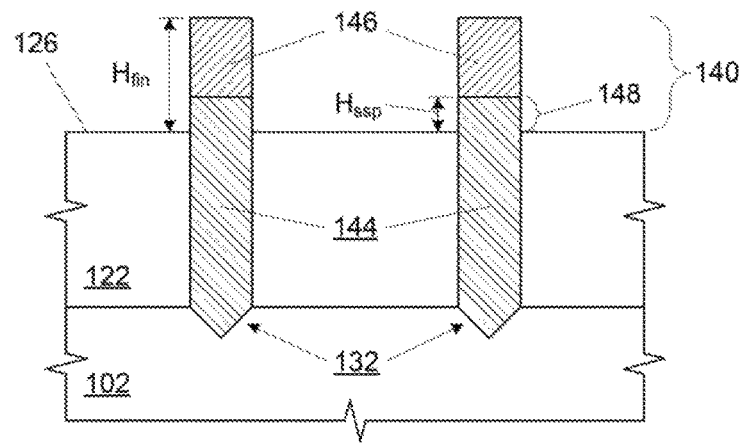

As shown in FIGS. 6 and 7, the isolation structures 122 may be recessed by an etching process, such that the active channel 146 and at least a portion 148 of the sub-structure 144 extends above an upper plane 126 of the isolation structures 122. As shown in FIG. 7, a height $H_{fin}$ of the active channel 146 and sub-structure portion 148 extending above the isolation structure upper plane 126 may be between about 20 nm and 80 nm. In an embodiment, the sub-structure portion 148 extending above the isolation structure upper plane 126 may have a height $H_{ssp}$ of between about 2 nm and 10 nm.

Figure 8:
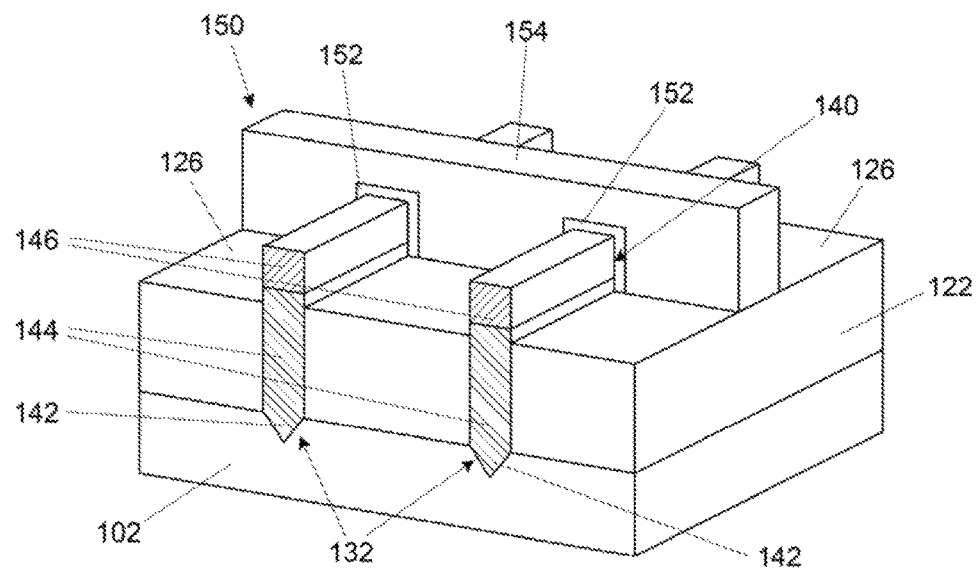

As shown in FIG. 8, at least one gate 150 may be formed over the active channel 146 and the sub-structure portion 148 of the sub-structure 144 to form a gated region 140 extending above the isolation structures 122. The gate 150 may be fabricated by forming a gate dielectric layer 152 on or adjacent to the fin upper surface 116 and on or adjacent to the pair of laterally opposing fin sidewalls 114, and forming a gate electrode 154 on or adjacent the gate dielectric layer 152, either by a gate first or a gate last process flow, as will be understood to those skilled in the art.

The gate dielectric layer 152 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer 152 can be formed by well-known techniques, such as by depositing a gate electrode material, such as chemical vapor deposition ("CVD"), physical vapor deposition ("PVD"), atomic layer deposition ("ALD"), and then patterning the gate electrode material with well-known photolithography and etching techniques, as will be understood to those skilled in the art.

The gate electrode 154 can be formed of any suitable gate electrode material. In an embodiment of the present disclosure, the gate electrode 154 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. The gate electrode 154 can be formed by well-known techniques, such as by blanket depositing a gate electrode material and then patterning the gate electrode material with well-known photolithography and etching techniques, as will be understood to those skilled in the art.

Figure 9:
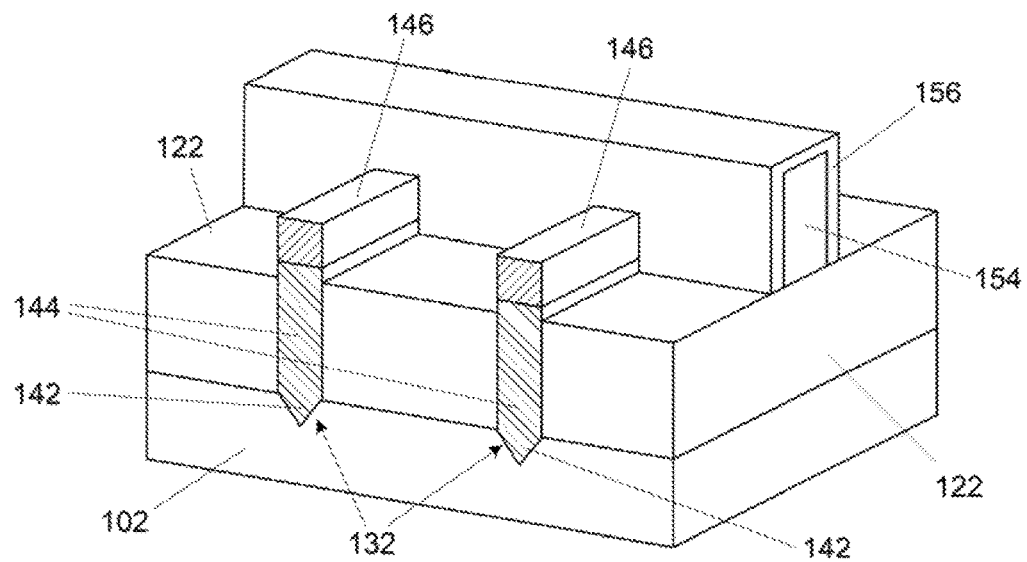

As shown in FIG. 9, a gate spacer 156 may be deposited and patterned on the gate electrode 154 with well-known deposition and etching techniques. The gate spacer 156 may be formed from any appropriate dielectric material, including, but not limited to, silicon oxide, silicon nitride, and the like.

It is understood that a source region and a drain region (not shown) may be formed in the active channel 146 on opposite sides of the gate 150 or a portions of the active channel 146 may be removed on opposite sides of the gate 150 and the source region and the drain region formed in place thereof. The source and drain regions may be formed of the same conductivity type, such as p-type or n-type conductivity. In some implementations of an embodiment of the present disclosure, the source and drain regions may have the substantially the same doping concentration and profile while in other implementations they may vary. It is understood that only n-MOS are shown, p-MOS regions would be patterned and processed separately.

Figure 10:
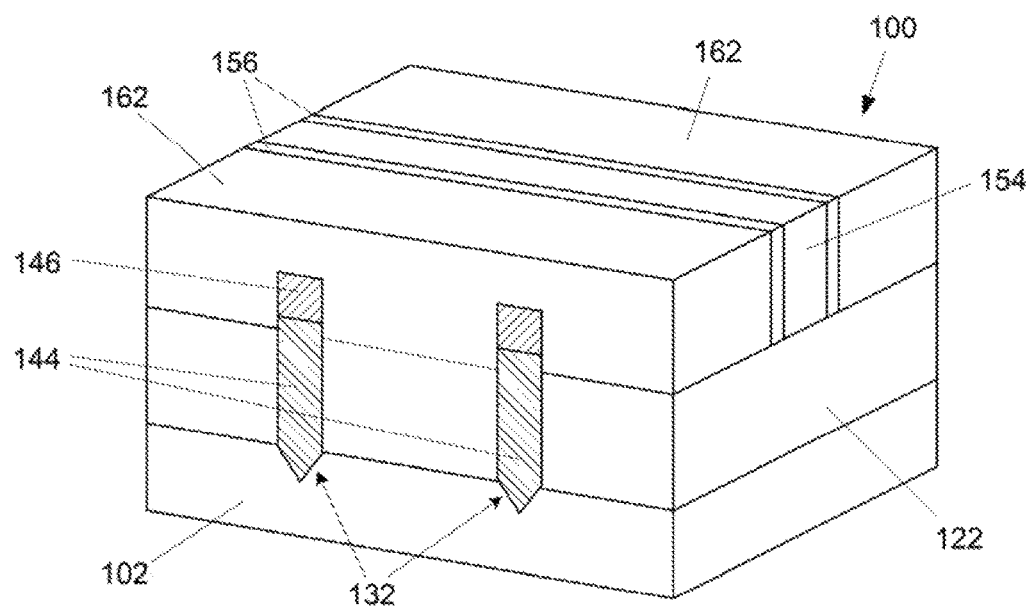

A dielectric layer 162 may deposited over the structure of FIG. 9 and planarized to expose the gate electrode 154 to form a non-planar transistor 100, as shown in FIG. 10.

As will be understood to those skilled in the art, the gate electrode 154 and the gate dielectric layer 152 could be sacrificial, such that a dummy gate process could be performed to form a final gate electrode and a final gate dielectric layer,.

It is noted that although the detailed description describes non-planar transistors, the present subject matter may be implemented in planar transistors, as will be understood to those skilled in the art.

Figure 11:
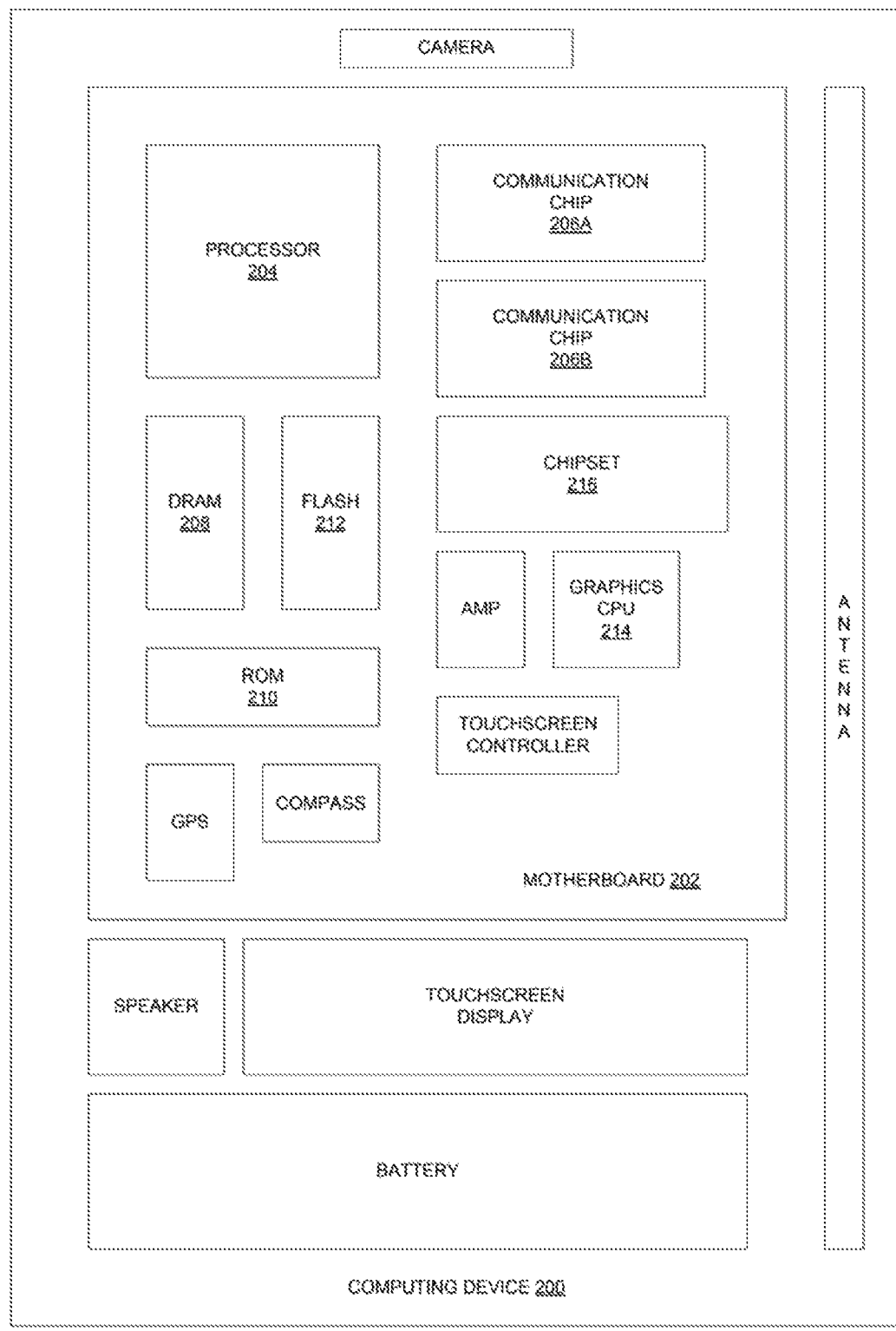
FIG. 11 illustrates a computing device in accordance with one implementation of the present description.

FIG. 11 illustrates a computing device 200 in accordance with one implementation of the present description. The computing device 200 houses a board 202. The board may include a number of microelectronic components, including but not limited to a processor 204, at least one communication chip 206A, 206B, volatile memory 208, (e.g., DRAM), non-volatile memory 210 (e.g., ROM), flash memory 212, a graphics processor or CPU 214, a digital signal processor (not shown), a crypto processor (not shown), a chipset 216, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 202. In some implementations, at least one of the microelectronic components may be a part of the processor 204.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. Any of the microelectronic components within the computing device 200 may include a microelectronic transistor including a buffer, such as a high band gap sub-structure, adjacent to an active channel of the microelectronic transistor, wherein a portion of the buffer extends into a gated region of the microelectronic transistor.

In various implementations, the computing device 200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 200 may be any other electronic device that processes data.

It is understood that the subject matter of the present description is not necessarily limited to specific applications illustrated in FIGS. 1-11. The subject matter may be applied to other microelectronic device and assembly applications, as well as any other appropriate transistor applications, as will be understood to those skilled in the art.

The following examples pertain to further embodiments, wherein Example 1 is a microelectronic structure, comprising a substrate; a low band-gap active channel; a high band-gap sub-structure disposed between the substrate and the low band-gap active channel, wherein the high band-gap sub-structure abuts the low band-gap active channel; at least one isolation structure abutting the high band-gap sub-structure, wherein a portion of the high band-gap sub-structure extends from the at least one isolation structure; and a gated region comprising the low band-gap active channel and the portion of the high band-gap sub-structure extending from the at least one isolation structure.

In Example 2, the subject matter of Example 1 can optionally include the high band-gap sub-structure comprising a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

In Example 3, the subject matter of any of Examples 1 and 2 can optionally include the low band-gap active channel comprising a material selected from the group consisting of indium gallium arsenide, indium arsenide, and indium antimonide.

In Example 4, the subject matter of any of Examples 1 to 3 can optionally include a nucleation trench extending into the substrate, wherein the high band-gap sub-structure extends from the nucleation trench.

In Example 5, the subject matter of Example 4 can optionally include the nucleation trench comprises a nucleation trench having (111) faceting.

In Example 6, the subject matter of any of Examples 1 to 5 can optionally include the high band-gap sub-structure having a depth greater than about 50 nm and a width of less than about 25 nm.

In Example 7, the subject matter of any of Examples 1 to 6, can optionally include a gate formed over the gated region.

The following examples pertain to further embodiments, wherein Example 8 is a method of forming a microelectronic structure, comprising forming at least one fin on a substrate, wherein the at least one fin comprises a pair of opposing sidewalls extending from the substrate; forming isolation structures abutting each of the fin sidewalls; forming a trench by removing the at least one fin; forming a high band-gap sub-structure in the trench; forming a low band-gap active channel in the trench, which abuts the high band-gap substructure; and recessing the isolation structures, such that the low band-gap active channel and at least a portion of the high band-gap sub-structure extend above the isolation structures.

In Example 9, the subject matter of Example 8 can optionally include forming the high band-gap sub-structure from a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

In Example 10, the subject matter of Example 8 can optionally include forming the low band-gap active channel from a material selected from the group consisting of indium gallium arsenide, indium arsenide, and indium antimonide.

In Example 11, the subject matter of Example 8 can optionally include forming a nucleation trench extending into the substrate.

In Example 12, the subject matter of Example 11 can optionally include forming the nucleation trench comprising forming a nucleation trench having (111) faceting.

In Example 13, the subject matter of Example 8 can optionally include forming the high band-gap sub-structure comprises forming a high band-gap sub-structure having a depth greater than about 50 nm and a width of less than about 25 nm.

In Example 14, the subject matter of Example 8 can optionally include forming a gate over the active channel and the portion of the high band-gap sub-structure extending above the isolation structures.

The following examples pertain to further embodiments, wherein Example 15 is an electronic system, comprising a board; and a microelectronic component attached to the board, wherein the microelectronic component includes at least one microelectronic transistor, comprising a microelectronic substrate; a low band-gap active channel; a high band-gap sub-structure disposed between the substrate and the low band-gap active channel, wherein the high band-gap sub-structure abuts the low band-gap active channel; at least one isolation structure abutting the high band-gap sub-structure, wherein a portion of the high band-gap sub-structure extends from the at least one isolation structure; a gated region comprising the low band-gap active channel and the portion of the high band-gap sub-structure extending from the at least one isolation structure; and a gate formed over the gated region.

In Example 16, the subject matter of Example 15 can optionally include the high band-gap sub-structure comprising a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

In Example 17, the subject matter of any of Examples 15 and 16 can optionally include the low band-gap active channel comprising a material selected from the group consisting of indium gallium arsenide, indium arsenide, and indium antimonide.

In Example 18, the subject matter of any of Examples 15 to 17 can optionally include a nucleation trench extending into the substrate, wherein the high band-gap sub-structure extends from the nucleation trench.

In Example 19, the subject matter of Example 18 can optionally include the nucleation trench comprises a nucleation trench having (111) faceting.

In Example 20, the subject matter of any of Examples 15 to 19 can optionally include the high band-gap sub-structure having a depth greater than about 50 nm and a width of less than about 25 nm.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic structure, comprising:
   a substrate;
   a low band-gap active channel;
   a high band-gap sub-structure disposed between the substrate and the low band-gap active channel, wherein the high band-gap sub-structure abuts the low band-gap active channel;
   at least one isolation structure abutting the high band-gap sub-structure, wherein a portion of the high band-gap sub-structure extends from the at least one isolation structure and wherein another portion of the high band-gap sub-structure extends into the substrate;
   a gated region comprising the low band-gap active channel and the portion of the high band-gap sub-structure extending from the at least one isolation structure; and
   a gate on the gated region, wherein the gate comprises a gate dielectric layer and a gate electrode, and wherein the gate dielectric layer contacts both the low band-gap active channel and the portion of the high band-gap sub-structure extending from the at least one isolation structure.

2. The microelectronic structure of claim 1, wherein the high band-gap sub-structure comprises a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

3. The microelectronic structure of claim 1, wherein the low band-gap active channel comprises a material selected from the group consisting of indium gallium arsenide, indium arsenide, and indium antimonide.

4. The microelectronic structure of claim 1, further including a nucleation trench extending into the substrate, wherein the high band-gap sub-structure extends from the nucleation trench.

5. The microelectronic structure of claim 4, wherein the nucleation trench comprises a nucleation trench having (111) faceting.

6. The microelectronic structure of claim 1, wherein the high band-gap sub-structure has a depth greater than about 50 nm and a width of less than about 25 nm.

7. A method of fabricating a microelectronic structure, comprising:
   forming at least one fin on a substrate, wherein the at least one fin comprises a pair of opposing sidewalls extending from the substrate;
   forming isolation structures abutting each of the fin sidewalls;
   forming a trench by removing the at least one fin;
   forming a high band-gap sub-structure in the trench, wherein the high band-gap sub-structure extends into the substrate;
   forming a low band-gap active channel in the trench, which abuts the high band-gap sub-structure;
   recessing the isolation structures, such that the low band-gap active channel and a portion of the high band-gap sub-structure extend above the isolation structures; and
   forming a gate, wherein the gate comprises a gate dielectric layer and a gate electrode, and wherein the gate dielectric layer contacts both the low band-gap active channel and the portion of the high band-gap sub-structure extending from the at least one isolation structure.

8. The method of claim 7, wherein forming the high band-gap sub-structure comprises forming the high band-gap sub-structure from a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

9. The method of claim 7, wherein forming the low band-gap active channel comprises forming the low band-gap active channel from a material selected from the group consisting of indium gallium arsenide, indium arsenide, and indium antimonide.

10. The method of claim 7, wherein forming the trench further includes forming a nucleation trench extending into the substrate.

11. The method of claim 10, wherein forming the nucleation trench comprises forming a nucleation trench having (111) faceting.

12. The method of claim 7, wherein forming the high band-gap sub-structure comprises forming the high band-gap substructure having a depth greater than about 50 nm and a width of less than about 25 nm.

13. An electronic system, comprising:
a board; and
a microelectronic component attached to the board, wherein the microelectronic component may include at least one microelectronic transistor comprising:
a microelectronic substrate;
a low band-gap active channel;
a high band-gap sub-structure disposed between the substrate and the low band-gap active channel, wherein the high band-gap sub-structure abuts the low band-gap active channel;
at least one isolation structure abutting the high band-gap sub-structure, wherein a portion of the high band-gap sub-structure extends from the at least one isolation structure and wherein another portion of the high band-gap sub-structure extends into the microelectronic substrate;
a gated region comprising the low band-gap active channel and the portion of the high band-gap sub-structure extending from the at least one isolation structure; and
a gate over the gated region, wherein the gate comprises a gate dielectric layer and a gate electrode, and wherein the gate dielectric layer contacts both the low band-gap active channel and the portion of the high band-gap sub-structure extending from the at least one isolation structure.

14. The electronic system of claim 13, wherein the high band-gap sub-structure comprises a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

15. The electronic system of claim 13, wherein the low band-gap active channel comprises a material selected from the group consisting of indium gallium arsenide, indium arsenide, and indium antimonide.

16. The electronic system of claim 13, further including a nucleation trench extending into the substrate, wherein the high band-gap sub-structure extends from the nucleation trench.

17. The electronic system of claim 16, wherein the nucleation trench comprises a nucleation trench having (111) faceting.

18. The electronic system of claim 13, wherein the high band-gap sub-structure has a depth greater than about 50 nm and a width of less than about 25 nm.

* * * * *